United States Patent [19]

Tubbs et al.

[11] Patent Number: 4,667,339
[45] Date of Patent: May 19, 1987

[54] LEVEL SENSITIVE LATCH STAGE

[75] Inventors: Graham S. Tubbs, Tempe; Martin D. Daniels, Houston, both of Tex.; Robert Schaaf, Saugerties, N.Y.; Ronald Walther, Austin, Tex.

[73] Assignee: Texas Instruments Incorporated, Dallas, Tex.

[21] Appl. No.: 557,783

[22] Filed: Dec. 5, 1983

[51] Int. Cl.[4] .............................................. G11C 11/34
[52] U.S. Cl. ................................. 377/79; 307/272 A
[58] Field of Search ................. 377/79, 115, 117, 105; 307/279, 272 A

[56] References Cited

U.S. PATENT DOCUMENTS

| | | | |
|---|---|---|---|
| 3,991,305 | 11/1976 | Caudel et al. | 235/156 |
| 4,156,819 | 5/1979 | Takahashi et al. | 377/117 |
| 4,461,965 | 7/1984 | Chin | 307/279 |
| 4,495,629 | 1/1983 | Zasio et al. | 377/79 |

Primary Examiner—John S. Heyman
Assistant Examiner—K. Ohralik
Attorney, Agent, or Firm—Richard K. Robinson; N. Rhys Merrett; Melvin Sharp

[57] ABSTRACT

A logic circuit that has a plurality of stages that are driven by a clock source that provides at least 2 clock signals and includes at least a single latch stage located between two of the plurality of stages is configured with field effect transistor technology. The latch stage includes an isolation means for isolating the preceding circuit of the plurality of stages from flow-through of the clocks and signals that are connected to the latch stage, and a latch circuit for storing the data that is applied to the latch stage between clock pulses. A plurality of latch stages can easily be configured as a shift register latch.

3 Claims, 14 Drawing Figures

LEVEL SENSITIVE LATCH STAGE

BACKGROUND OF INVENTION

This invention relates to logic circuits configured with field effect transistors, more particularly to logic circuits configured with field effect transistors to form a latch and in particular, a shift register latch.

An example of the prior art shift register latch 100 is provided in FIG. 241, in which there is a first latch stage 1 and a second latch stage 11. The first latch stage receives inputs in the form of data to a combination logic circuit, which in the case of FIG. 1, is an AND-OR combination 3 and at the occurrence of clock 2, the data on terminal 2 is loaded into a master latch 5 or at the occurrence of clock 1 the data on terminal 4 is loaded into the master latch 5. The master latch 5 stores the data and provides a representative sample of the data that's stored therein on its output terminal 6, which at the occurrence of clock 3 is loaded into a slave latch 7. The master latch 5 stores the data internally until the occurrence of a clock 3, when it is stored in the slave latch 7. The slave latch 7 stores the data, as well as provides a representative sample of the stored data on output terminal 9 and shift terminal 8 for application to the second stage shift register latch 11. The second stage shift register latch 11 includes an input combination circuit 13, which in the embodiment of FIG. 1, is an AND-OR combination, a master latch 15 and a slave latch 17. The master latch 15, at the occurrence of either clock 1 or 2 will store either the data that is on terminal 10 or 8, respectively, and present a representation thereof on terminal 12 for application to the slave latch 17, which will store the logic level that is present on terminal 12 at the occurrence of clock 3, and present a representation thereof on its output terminal 14.

In FIG. 2, to which reference should now be made, there is illustrated a waveform diagram of the shift register latch of FIG. 1, which is, in the embodiment shown in FIG. 1, a prior art representation of a level sensitive, shift register latch. There are 3 clocks provided to the shift register latch necessary for the shift register latch 100 of FIG. 1 to operate. They are clocks 1 and 2, which store the data into the master latches 5 and 15, and clock 3, which loads data into the slave latches 7 and 17. Clocks 1 and 2 are represented by waveform 20, and clock 3 is represented by waveform 22.

The shift register latch disclosed in FIG. 1 requires the multiple clocking arrangements that are indicated in FIG. 2, and requires that in the combination logics 3 and 13 decisions must be completed by the trailing edge of clock 1 that is represented by waveform 20. This creates a problem in dynamic field effect transistor logic when clock 3 is to be used to discharge the last stage of the combination logic, which is a necessary requirement for speed enhancement of the device. Therefore, the prior art shift register latch is limited and unsuitable for high-speed applications.

SUMMARY OF THE INVENTION

A logic circuit that has a plurality of stages that are driven by a clock source that provides at least 2 clock signals and includes at least a single latch stage located between two of the plurality stages is configured with field effect transistor technology. The latch stage includes an isolation means for isolating the preceding circuit of the plurality of stages from flow-through of the clocks and signals that are connected to the latch stage, and a latch circuit for storing the data that is applied to the shift register latch stage between clock pulses. A plurality of latch stages can easily be configured as a shift register latch.

A plurality of latch stages can be connected to include a testing circuit that enables the sampling of data stored within the latch or presetting data within the latch.

There are several embodiments of the latch stage using both enhancement field effects transistors for the configuration thereof; as well as complicated combination logics for implementing logic operations on the data that is applied to each latch stage.

These and other features and objects of the invention will be more apparent from a reading of the specification in combination with the figures in which:

DETAILED DESCRIPTION OF THE PREFERRED EMBODIMENT

Figure 1:
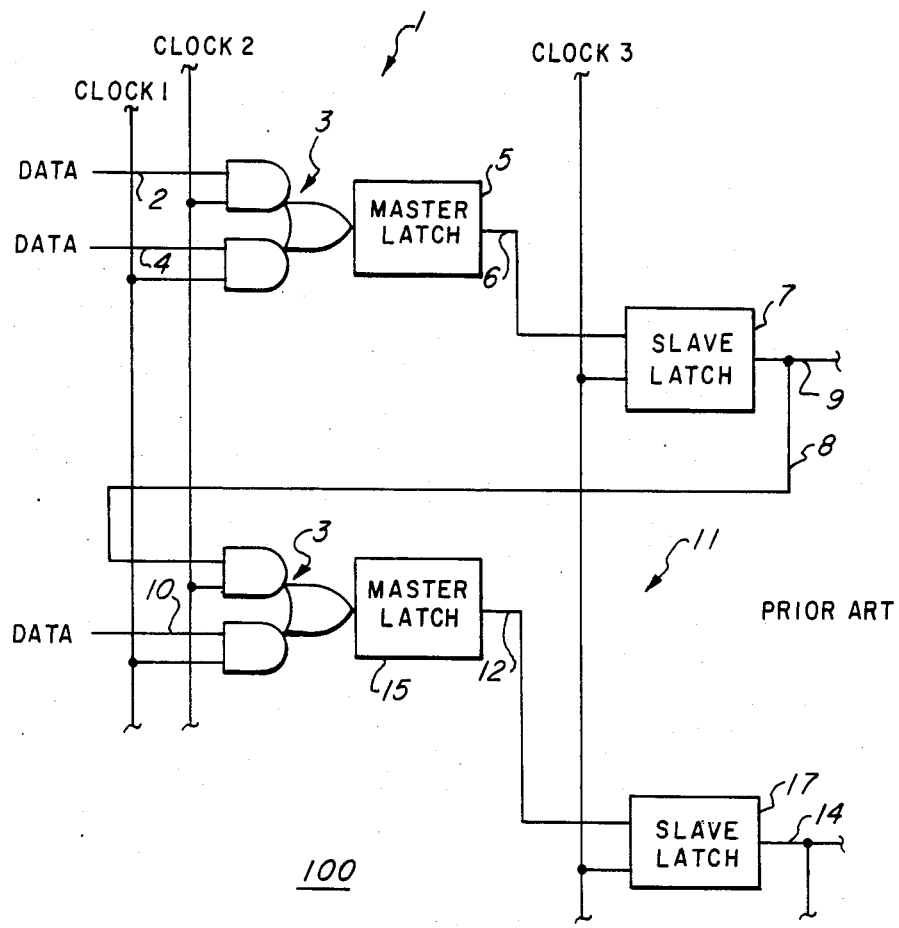
FIG. 1 is a logic diagram of a prior art shift register latch.
Figure 2:
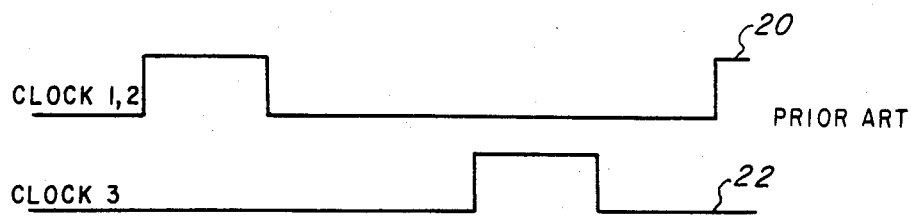
FIG. 2 is a timing diagram of the prior art shift register latch of FIG. 1.
Figure 3:
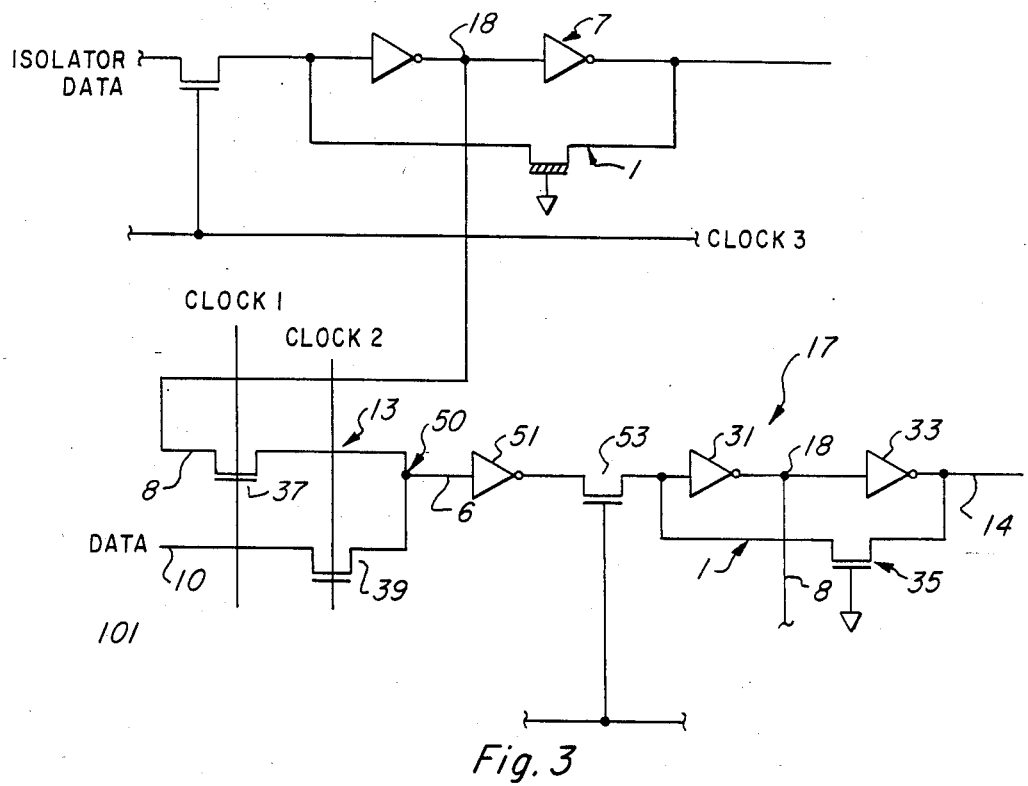
FIG. 3 is a logic diagram of a plurality of latch stages implemented with field effect transistors according to the invention configured with testing capabilities as well as a shift register latch.
Figure 4:
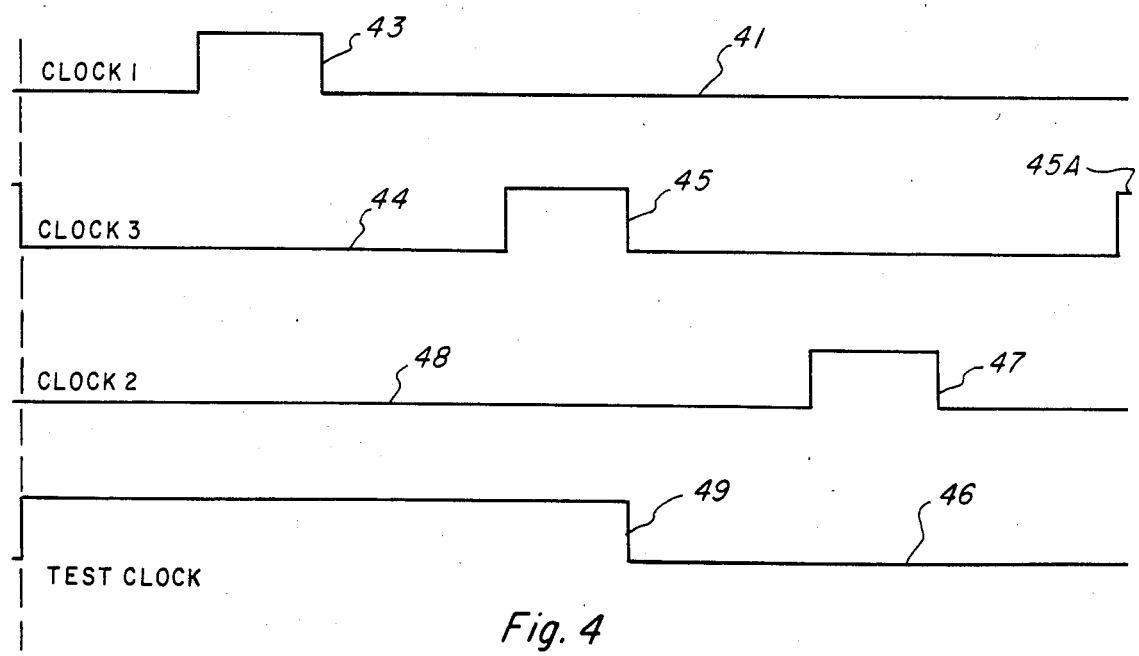
FIG. 4 is a timing diagram of the operation of the circuit of FIG. 3.

In FIG. 3, to which reference should now be made, there is shown a logic diagram of an embodiment of a plurality of latch stages 1, configured as a shift register latch 101 according to the invention. A first latch stage 7 is llustrated in which the output is applied by conductor 8 to a combination logic 13 that includes a first transistor switch 37 and a second transistor switch 39. The transistor switch 37 provides isolation between conductor 8 and node point 50 and transistor 39 provides isolation between conductor 10 and node point 50. Clock 2 of FIG. 4 is used to parallel load data into each latch stage 1 where it is stored in the latch stage 1 by clock 3. At the occurance of pulse 47 of waveform 48 the data on conductor 10 is transferred by field effect transistor switch 39 to node 50. Pulse 45A of waveform 44 then loads the data represented by signal charge at node 50 into the inverting amplifier 31 where it is stored as in the test mode operation which will be discussed next.

It is often desirable in the manufacture, assembly and programming of logic circuits that are configured with field effect transistors to be able to detect faults at different nodes. A unique feature of the shift register latch illustrated in FIG. 3 is the fact that a test signal may be shifted to the transistor switch 37 from the first latch stage 7 via conductor 8 and transferred through the node 50, the inverting amplifier 51 and to the output 14 of the latch circuit 17 at the occurrence of a test clock that is represented by waveform 41 and 46 and in particular, pulse 43 of waveform 41.

At the occurrence of a logic 1 in the clock 1 signal, waveform 41 of FIG. 4, in particular, pulse 43, the logic level of node 18 is present on conductor 8 and is transferred to the node point 50 and at the removal of the pulse 43; the logic state is stored at node point 50 or is present at node point 50 by the storage thereof in the internal capacitance of the inverter 51. At the occurrence of a positive transistion of a logic 1 level on clock 3 that is represented by pulse 45 of waveform 44 illustrated in FIG. 4, the logic level that is present at node point 50 and stored within the internal capacitance of the inverter 51 is transferred to the second latch stage 17, where it is stored and permanently held therein by the latch circuit that is configured by the inverting amplifiers 31 and 33 as well as the depletion transistor 35 which connects the output of the inverting amplifier 33 to the input of the inverting amplifier 31. The output of the latch is provided on conductor 14 and the shift output is provided on conductor 8.

It should be noted that clock 3 is present during the test operations, which enables the second latch stage 17 to be loaded with the test data that is present on conductor 8. With this feature, it is possible to test every circuit that is configured within the shift register latch circuit 101. This feature can greatly enhance the program development of microprocessor circuits that incorporate this type of latch stage.

Figure 5:
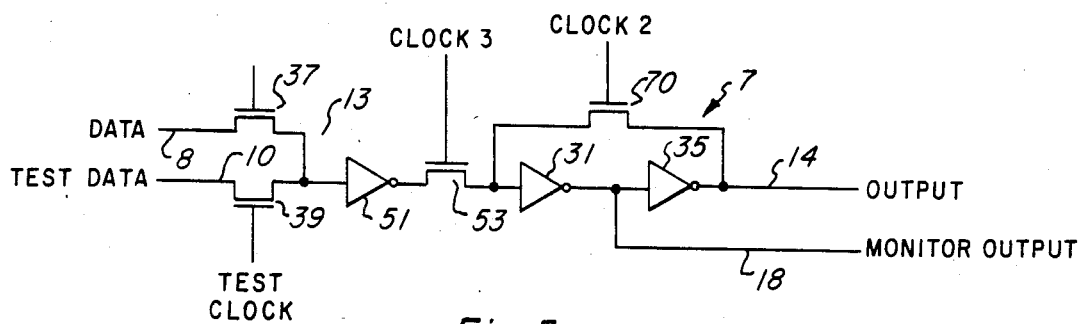
FIG. 5 is a logic diagram of a single latch stage according to the invention.

FIG. 5 is a logic diagram of a single latch stage 1 in which the combination logic 13 includes a first transistor switch 37 and a second transistor switch 39. The data that's on the input conductors 8 and 10 are applied via the transistor switches 37 and 39, respectively, to the inverter 51 for loading into the latch stage 1 via the occurrence of a logic 1 on clock 3 which activates the switch 53 connecting the output of inverting amplifier 51 to the input of amplifier 31. Occasionally, in the embodiment of FIG. 3, rather than using a depletion field effect transistor 35 to connect the output of the inverting amplifier 33 to the input of the inverting amplifier 31 a refresh signal is provided to the field effect transistor 70 at the occurrence of a logic one in the clock 2, which applies the output of the inverting amplifier 35 to the inverting amplifier 31, regenerating the charge that is stored in the amplifier 31 so that the signal that is present on conductors 14 and 18 accurately reflect the logic level that is stored within the latch stage 1.

Figure 6:
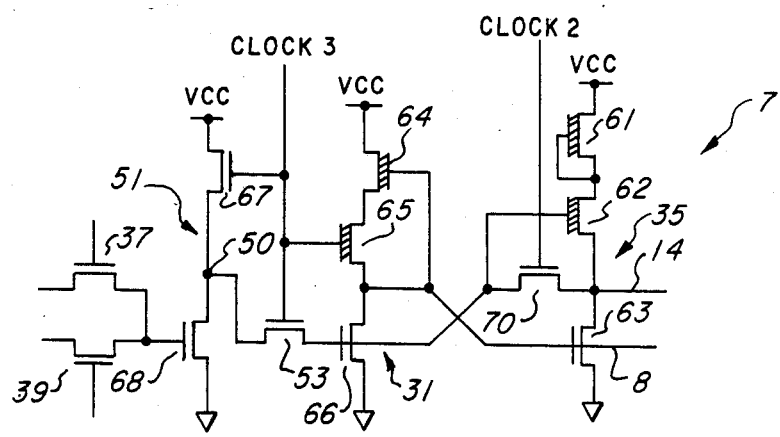
FIG. 6 is a schematic diagram of a latch stage that is configured with an enhancement field effect transistor for the input amplifier and depletion, depletion/depletion, depletion transistors used for the shift register latch.

FIG. 6 is a schematic diagram of an implementation of a latch stage 1 and is an embodiment of an enhancement, depletion, depletion circuit in that the amplifier 51 utilizes enhancement transistors and amplifiers 31 and 35 utilize depletion transistors. The amplifier 51 includes the input field effect transistor 68 and the clocking transistor 67 which, depending on the logic level that is applied to the input of the field effect transistor 68 at the occurrence of clock 3, the node 50 is either connected to ground if field effect transistor 68 is on, or to VCC if transistor 68 is off. The inverter amplifier 31 includes a series combination of two depletion field effect transistors 64 and 65 and an input transistor 66 which is activated by the closing of the field effect transistor switch 53. This action causes the data to be stored within the latch stage 1. Switch 70 is the refresh switch. The amplifier 35 operates in a similar fashion.

Figure 7:
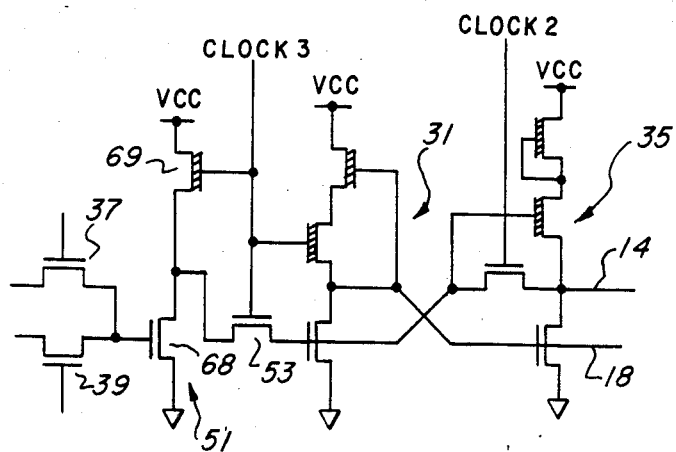
FIG. 7 is an example in which a depletion transistor can be used in configuring the input amplifier of FIG. 5.

FIG. 7 is an example of a depletion, depletion/depletion, depletion/depletion embodiment of the stage 1 in which the amplifier 51 is implemented with a depletion transistor 69 and an enhancement transistor 68. Amplifiers 31 and 35 are implemented as in the embodiment of FIG. 6.

Figure 8:
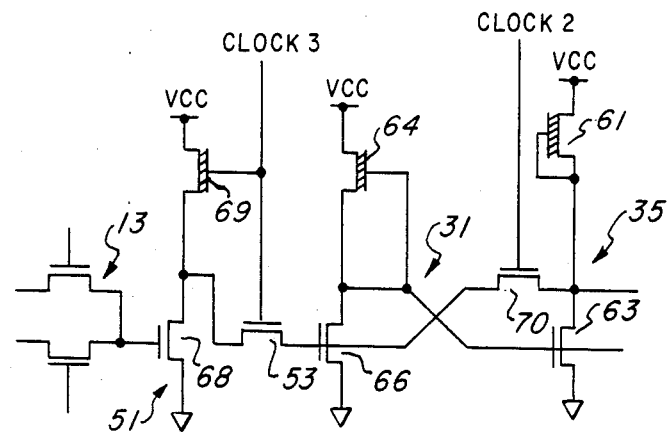
FIG. 8 is a schematic diagram of the shift register latch of FIG. 5 in which each amplifier stage has incorporated therein a single depletion transistor.

FIG. 8 is an example of a depletion, depletion/depletion embodiment of the latch stage 1 according to the invention. In FIG. 8, amplifier 51 is implemented with a depletion transistor 69 and an enhancement transistor 68 and the inverting amplifiers 31 and 35 are implemented with a single depletion transistors 64 and 61, respectively. Input transistor 66 and an output transistor 63 are enhancement type field effect transistors.

Figure 9:
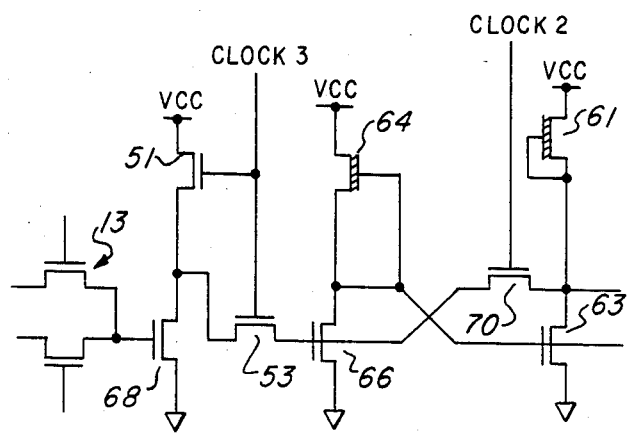
FIG. 9 is a schematic diagram of the shift register latch according to FIG. 5 in which the input amplifier has an enhancement transistor.

FIG. 9 is an embodiment of an enhancement, depletion, depletion implementation of the latch stage 1 according to the invention and utilizes the circuit arrangements for the input amplifier 51 illustrated in FIG. 6, and the latch circuit arrangements illustrated in FIG. 8.

Figure 10:
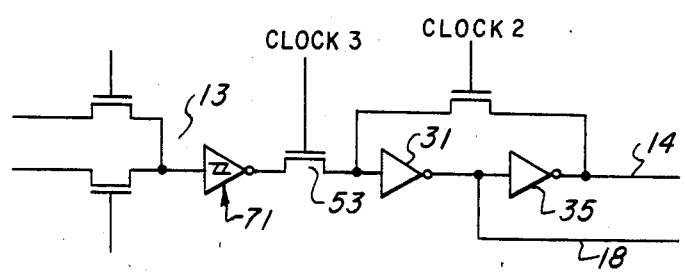
FIG. 10 is a logic diagram of the latch stage according to the invention having a Schmitt trigger input stage.

In the situation where it is necessary to interface the latch with a transistor, transistor logic (TTL) circuit, such as that encountered for an input buffer application, FIG. 10 illustrates a circuit having such capabilities and has incorporated therein a Schmitt trigger 71 which is used in lieu of the inverting amplifier 51 illustrated in FIGS. 5 through 9.

Figure 11:
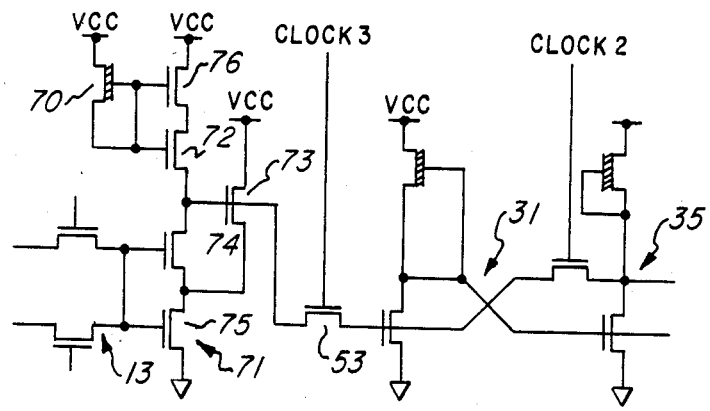
FIG. 11 is a schematic diagram of the embodiment of FIG. 10.

FIG. 11 provides the circuit for the Schmitt trigger 71 and includes a series connection of field effect transistors 76, 72, 74 and 75. Bias is provided to field effect transistors 72 and 76 by depletion field effect transistor 70, which provides the Schmitt trigger waveshaping effect to the signals that are applied to field effect transistors 74 and 75. The output from the Schmitt trigger is provided on the output terminal of field effect transistor 73 and applied to the switch 53.

There are situations where it is desirable to combine several functions logically before loading the latch stage 1. This embodiment is provided in FIG. 12 in which 3 data input signals, data X, Y, and Z, are applied to an AND-NOR combination that includes the AND gate 80 and the NOR gate 81. Additionally, the combination is NORed with the test data from the field effect transistor 86 as in the other embodiments, to enable the testing of the latch stage 1 that is configured with the inverting amplifiers 31 and 35. Switch 53 connects the output of the NOR gate 81 to the input of the inverting amplifier 31.

Figure 12:
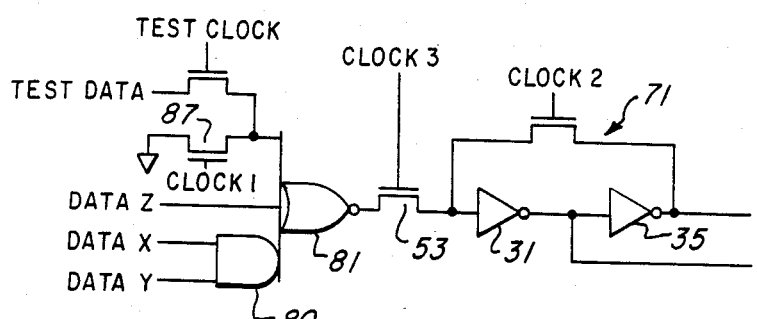
FIG. 12 is a logic diagram of a latch stage having an AND OR input circuit.
Figure 13:
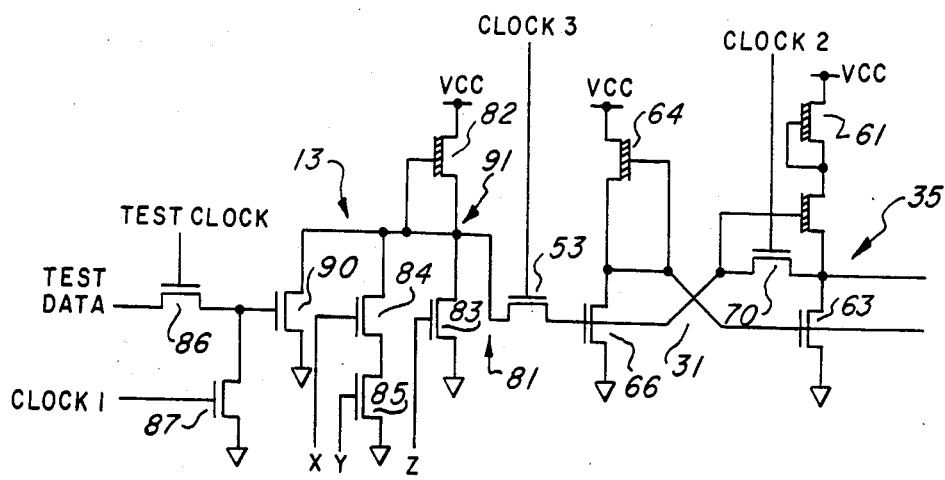
FIG. 13 is a schematic diagram of the embodiment of FIG. 12.

A schematic diagram of the embodiment of FIG. 12 is provided in FIG. 13, to which reference should now be made.

The AND gate 80 includes the field effect transistors 84, and 85 and the NOR-gate 81 includes the depletion transistor 82 and a field effect transistor 83 as well as the field effect transistor 90, the combination of which are tied together to form an NOR node, generally located at position 91.

Figure 14:
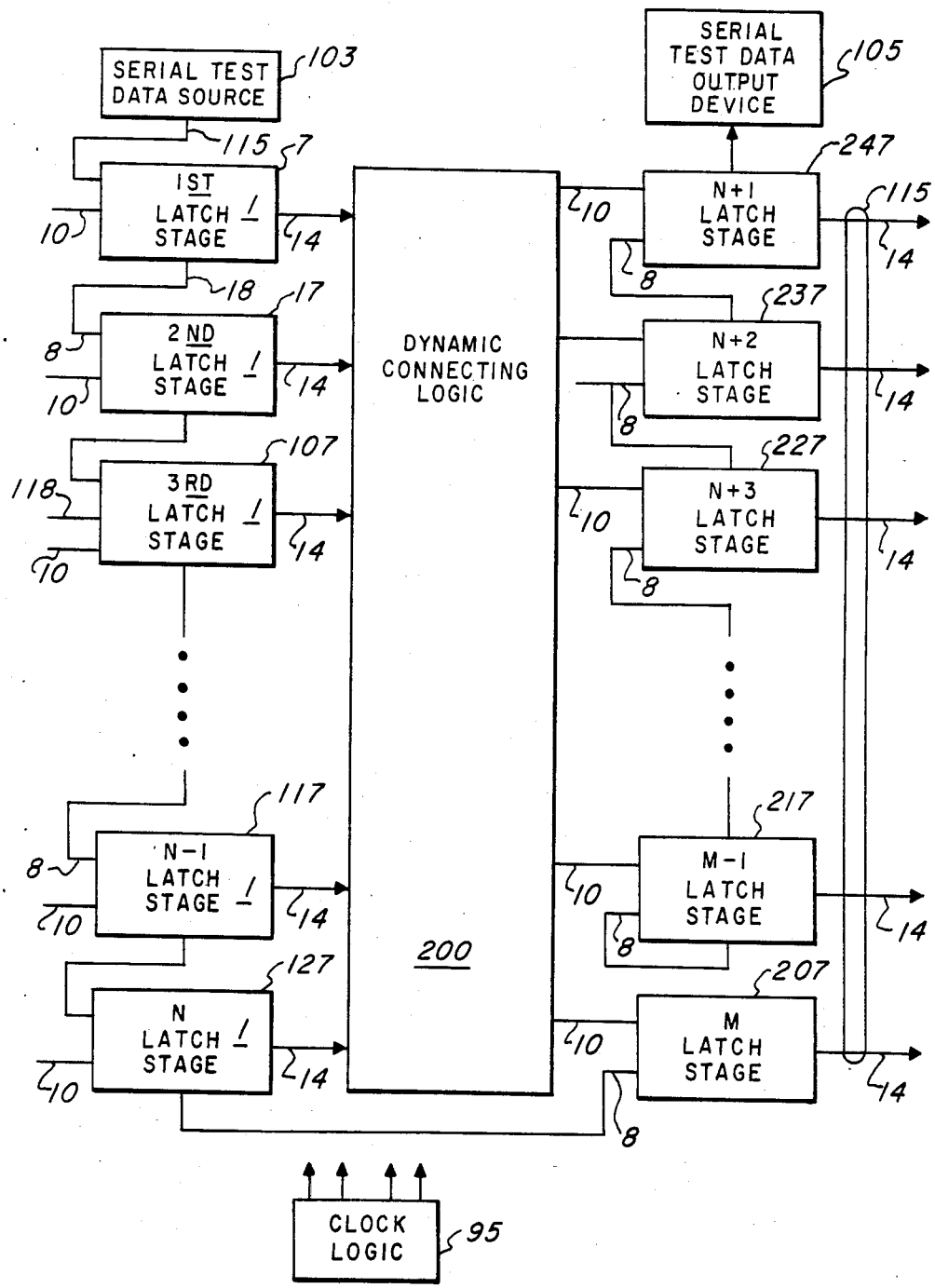
FIG. 14 is a block diagram of the application of a plurality of latch stage arrayed for circuit testing.

FIG. 14 illustrates an example of a first embodiment of a shift register latch circuit according to the invention when used in a circuit arrangement. A combination of a plurality M of latch stages 1 illustrated in FIG. 14, and is connected to a dynamic connecting logic 200 which contains only combinatorial logic all storage elements are configured with the Latch stages 1.

There is shown a first latch stage 7, a second latch stage 17, a third latch stage 107 through and N−1 latch stage 117 and N latch stage 127 on the input side of connecting logic 200 and N+1 latch stage 247, N+2 latch stage 231, N+3 latch stage 227, M−1 latch stage 217 and M latch 207 on the output side of the connecting logic 200. Clock logic 95 provides the clocks 1, 2, 3 and test clocks to the different latch stages and a serial test data source 103 provides the data signals to the first latch stage 7. The latch stages are connected in a series to parallel arrangement wherein the data is only carried in to each stage by conductor 10 and test data is carried in by conductor 214 to the first latch stage 7 and is shifted to the preceding latch stages via shift conductors 8. Simultaneously, with the latching of the data within each latch stage, the logic state is provided on the output terminal 14 for parallel application to connecting logic. Additionally, a serial test data device 105 accepts from output conductor 8 the states that are contained within each latch stage that are shifted to it. Parallel output from the N+1 to M latch stages are provided by the conductors 14 contained within the data bus 115. The clock logic 95, although illustrated in the embodiment of FIG. 4 as being a portion of the shift register latch may be an external clock such as that contained within a microprocessor in which the different clock phases are generated for use by the circuit. Additionally, shift register latch 107 is a combination shift register latch in which three sets of data are provided from data input bus 111 via data conductor 118.

Although the present invention has been described in relation to specific environments, it will be clearly understood by those skilled in the art that other optional features may be included within the shift register latch or substituted for features described without departing from the scope of the invention.

What is claimed is:

1. A logic circuit for storing of an input signal, having a plurality of stages of at least a first and second stage that are driven from a clock source means that provides a first and second clock signal with the second clock signal having a single phase, the second stage being configured with field effect transistors and the first stage having at least a shift output connected to the second stage, the second stage comprises:

isolation means for electrically isolating the second stage from the first stage and for connecting the shift output to the second stage only when the first clock signal is present;

the second stage includes a latch means and gate means between said isolation and latch means for providing a first logic signal on a shift terminal and a second logic signal on an output terminal in response to the second clock signal applied to said gate means; and the latch means includes, a first inverting amplifier having an input, and an output forming said shift terminal and a means for storing data and whose input is connected to the isolation means, a second inverting amplifier having an input and output and a means for storing data and whose input is connected to the output of the first inverting amplifier and whose output is the output terminal, and feedback path connecting the output of the second inverting amplifier to the input of the first inverting amplifier.

2. The logic circuit according to claim 1 further comprising:

test circuit means for testing of the latch stage.

3. The logic circuit according to claim 2 wherein the test circuit includes:

clock means for generating a test pulse;

a gate input logic circuit means for gating the input signal with the test pulse; and output circuit means for sampling the logic state of the latch means.

* * * * *